United States Patent [19]

McClintock et al.

[11] Patent Number: 5,128,565

[45] Date of Patent: Jul. 7, 1992

[54] SENSE AMPLIFIER WITH INCREASED SPEED AND REDUCED POWER CONSUMPTION

[75] Inventors: Cameron McClintock, Mountain View; Hock C. So, Redwood City, both of Calif.

[73] Assignee: Altera Corporation, San Jose, Calif.

[21] Appl. No.: 596,764

[22] Filed: Oct. 12, 1990

[51] Int. Cl.[5] .............................................. G11C 7/00
[52] U.S. Cl. ................................ 307/530; 307/443
[58] Field of Search ............... 307/530, 350, 263, 443

[56] References Cited

U.S. PATENT DOCUMENTS 4,814,647  3/1989  Tran .................................. 307/530 X
4,899,070  2/1990  Ou et al. .............................. 307/530

Primary Examiner—Steven Motolla
Attorney, Agent, or Firm—Robert R. Jackson

[57] ABSTRACT

In a programmable logic device sense amplifier, switching speed is increased and quiescent power consumption is decreased by incorporating an auxiliary high-speed circuit which assists the sense amplifier to charge the parasitic capacitance of the output node during, and for a short time after, that node's low-to-high voltage transitions. The auxiliary circuit presents a high resistance to the output node at times other than during and shortly after low-to-high transitions, and therefore does not affect the operation of the sense amplifier at these other times. The sense amplifier can be operated in single-ended bit line mode in complementary bit line mode.

8 Claims, 5 Drawing Sheets

SENSE AMPLIFIER WITH INCREASED SPEED AND REDUCED POWER CONSUMPTION

BACKGROUND OF THE INVENTION

This invention relates to programmable logic devices (PLDs) and, more particularly, to improved bit line sense amplifiers for PLDs.

PLDs and sense amplifiers for use in PLDs are well known as shown, for example, by such references as Hartmann et al. U.S. Pat. No. 4,617,479, Wong et al. U.S. Pat. No. 4,871,930, and Ou et al. U.S. Pat. No. 4,899,070, all of which are hereby incorporated by reference herein.

There is continuing demand for PLDs which have more interconnected devices, are faster, and consume less power than those previously available. However, these are conflicting objectives because as the number of interconnected devices increases, power consumption increases and speed decreases.

Conventional PLD sense amplifiers consume dc (or quiescent) power under certain circumstances which are common in practice. This power consumption can be controlled by adjusting the geometry of output transistors in the PLD sense amplifier; however, doing so affects the output voltage transition rates. With high power consumption, the output transition rates can be rapid, and the low-to-high transition rate can be made substantially equal to the high-to-low transition rate. Reducing the power consumption slows down the low-to-high transition rate. Thus, a compromise between power consumption and low-to-high transition rate must be accepted.

Sense amplifiers configured with complementary bit lines, as sometimes used in electrically programmable read only memory (EPROM) designs, do not consume quiescent power. However, there is an inherent difference in the input to output delay depending on whether the output is switching low to high or high to low. There are two reasons for this effect. Firstly, the circuitry which pulls the output voltage low controls the state of the amplifier and, during an output voltage transition, works against the circuitry which pulls the output voltage high. Thus, the pull-up circuitry must be weaker than the pull-down circuitry. This results in the low-to-high transition being slower than the high-to-low transition. Secondly, the output is pulled low directly by a bit line going low. However, additional circuitry is required to pull the output high when the bit line complement goes low. This additional circuitry introduces extra delay. Thus, the time between a change of state of a bit line and the initiation of a corresponding high-to-low transition of the output is shorter than the time between a change of state of a bit line and the initiation of a corresponding low-to-high transition of the output.

In view of the foregoing, it is an object of this invention to provide a sense amplifier with an increased low-to-high output voltage transition rate and reduced quiescent power consumption when operating with single-ended bit lines.

It is a further object of this invention to provide a sense amplifier with an increased low-to-high output voltage transition rate but which still consumes no quiescent power when operating with complementary bit lines.

SUMMARY OF THE INVENTION

These and other objects of the invention are accomplished in accordance with the principles of the invention by providing a PLD sense amplifier having auxiliary pull-up circuitry to increase the speed of the low-to-high voltage transition at its output.

A feature of the invention is the use of cross-coupled load transistors which ensures than no power is drawn by the sense amplifier under quiescent conditions.

A consequence of the invention is that the PLD sense amplifier can be programmed by the user to operate either in a conventional single-ended bit line mode, or in a complementary bit line mode.

Other features of the invention, its nature and various advantages will be more apparent from the accompanying drawings and the following detailed description of the preferred embodiments.

BRIEF DESCRIPTION OF THE DRAWINGS

FIG. 4b is a set of voltage versus time graphs for selected nodes of the circuit in FIG. 4a.

DETAILED DESCRIPTION OF THE PREFERRED EMBODIMENTS

Figure 1:
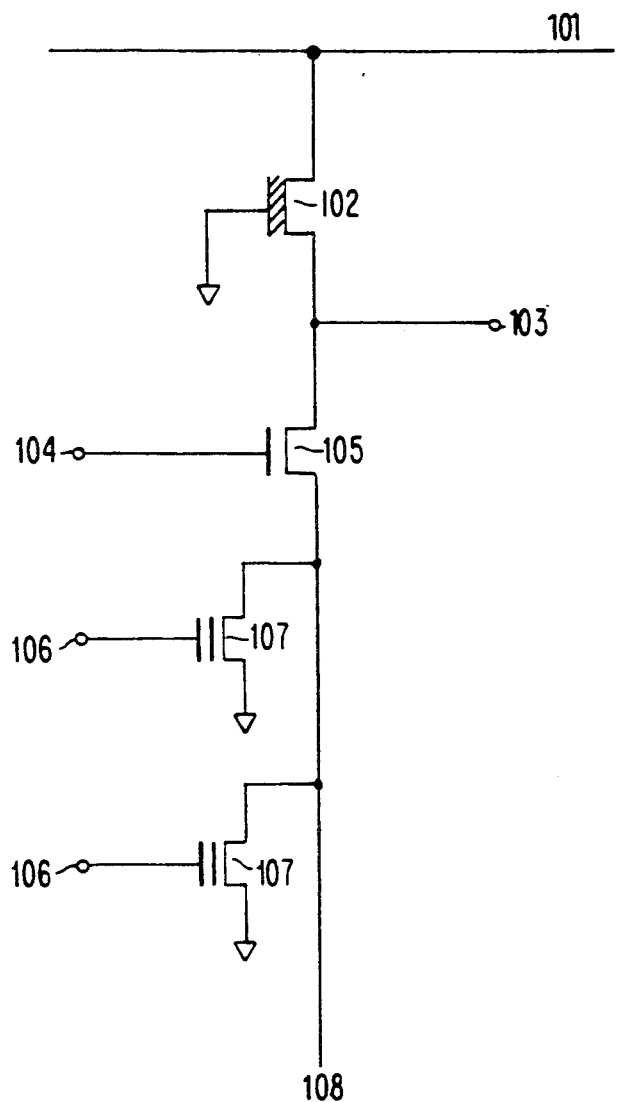
FIG. 1 is a schematic diagram of a conventional PLD sense amplifier.

FIG. 1 shows a schematic diagram of part of a conventional PLD sense amplifier. The drains of floating-gate transistors 107 are connected together to form bit line 108. Floating-gate transistors 107 are "addressed" by word lines 106 connected to their control gates. The sources of transistors 107 are grounded, and thus their gate-to-source voltages are equal to the word line 106 voltages.

The logical operation of PLDs is determined by which floating-gate transistors 107 are "programmed" and which are "erased." When floating-gate transistors 107 are programmed, they are switched off (i.e., have a high drain-to-source resistance), regardless of the voltage on the associated word line 106. When floating-gate transistors 107 are erased, their drain-to-source resistances depend on the associated word line 106 voltages as follows: when a floating-gate transistor 107 is erased and the associated word line 106 voltage is high, that transistor is switched on, forming a low resistance path from drain to source; and when a floating-gate transistor 107 is erased and the associated word line 106 voltage is low, that transistor is switched off, forming a high resistance path from drain to source.

Transistor 105 is a cascode device which shields the voltage of output node 103 from the voltage of bit line 108 and allows fast voltage transitions to take place on node 103. Transistor 105 switches on when its source is pulled low because its gate is held at a reference voltage 104.

The sense amplifier of FIG. 1 operates as follows: If a word line 106 is high and the floating-gate transistor 107 to which it is connected is erased, then that transistor switches on and pulls bit line 108 low. This causes cascode transistor 105 to switch on and to pull output node 103 low. Alternatively, if all word lines 106 are low, or if the only word lines that are high feed the gates of programmed floating-gate transistors, then no floating-gate transistors are switched on, and bit line 108 is not held low. Thus, there is no low resistance path from node 103 to ground, and node 103 is held high by p-channel load transistor 102.

One disadvantage of the PLD sense amplifier shown in FIG. 1 is that it can consume quiescent power. This is because p-channel load transistor 102 is permanently switched on due to its gate being connected to ground and its source being connected to power supply $V_{cc}$ at node 101. When bit line 108 is low (as would be the case when any of floating-gate transistors 107 are conducting), direct current passes from $V_{cc}$, through load transistor 102, through cascode transistor 105, through one or more floating-gate transistors 107 to ground. Thus quiescent power is consumed.

The quiescent power consumption can be reduced by weakening pull-up transistor 102, relative to the pull-down circuit comprising transistors 105 and 107 in series, so that only a small quiescent current flows. However, node 103 has an associated parasitic capacitance which must be charged by current flowing through transistor 102 to bring the voltage of node 103 up. Decreasing the amount of available current would reduce the speed of the low-to-high voltage transition at output node 103. Thus, a compromise between quiescent power consumption and low-to-high voltage transition rate must be accepted in conventional PLD sense amplifiers.

Figure 2:
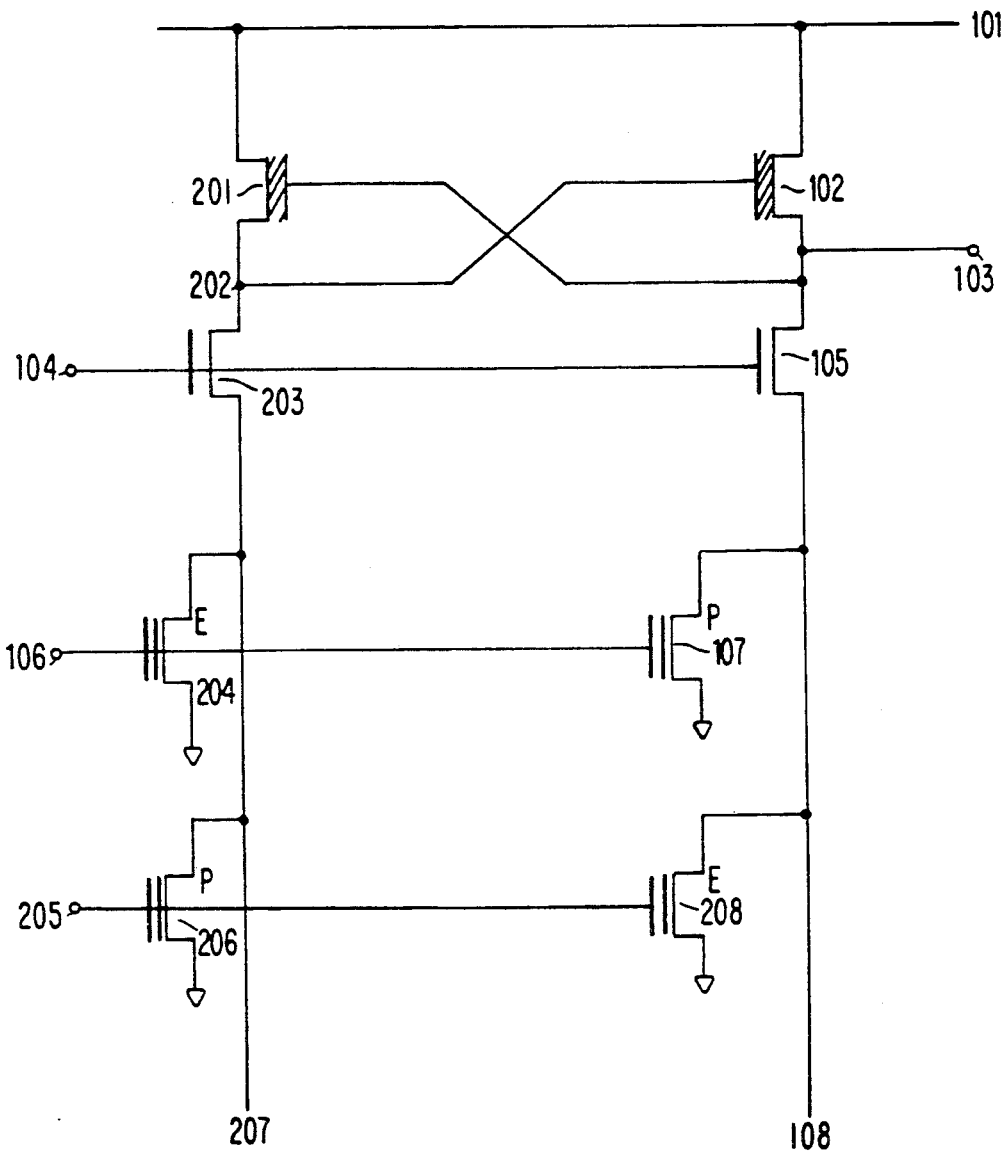
FIG. 2 is a schematic diagram of a conventional sense amplifier with complementary bit lines.

The compromise between quiescent power consumption and transition rate does not exist in sense amplifiers operating in complementary bit-line mode. FIG. 2 shows such a conventional sense amplifier which does not consume quiescent power, but has the disadvantage that the low-to-high output voltage transition can still be slow. In complementary bit-line mode, word lines 106 and 205 are logical complements of one another, bit lines 108 and 207 are logical complements of one another, and floating-gate transistors are programmed and erased in complementary pairs. FIG. 2 shows an example of this configuration, where the letter "P" adjacent to a transistor indicates that the corresponding transistor is programmed, and the letter "E" adjacent to a transistor indicates that the corresponding transistor is erased.

Consider a high-to-low transition of output node 103 of the sense amplifier of FIG. 2. A stable quiescent state prior to this transition could be maintained, for example, by word line 106 being held high and word line 205 being held low. This holds transistors 204, 203, and 102 switched on, and transistors 208 and 201 switched off. The transition is initiated when the voltage of word line 106 goes low and that of word line 205 goes high. This switches transistor 208 on, which starts to bring down the voltage of bit line 108. This falling voltage causes the gate-to-source voltage of transistor 105 to rise. When this rising voltage exceeds the threshold voltage of transistor 105, that transistor also switches on forming a dc path from node 103 to ground. This brings down the voltages of node 103 and of the gate of p-channel load transistor 201. After node 103 reaches a sufficiently low level, transistor 201 switches on, starting to take the voltage of node 202 high and switching transistor 102 off. When transistor 102 switches off, it removes the pull-up on node 103, and prevents any quiescent current flow through transistors 105 and 208. In this way, a change of state on the word lines has caused a corresponding change in the state of output node 103.

Voltage transitions of output node 103 are controlled by the pull-down circuit comprising transistors 105 and 208 in series. During high-to-low transitions, the pull-down circuit works against the pull-up circuit which comprises transistor 102. The pull-up circuit must therefore be weak enough that the pull-down circuit is able to pull the voltage of node 103 down even with transistor 102 attempting to hold it high. Furthermore, the pull-up circuit should be weak enough to allow the output voltage to be pulled down sufficiently to be recognized as a low voltage by subsequent circuitry. Thus, transistor 102 is designed to pull the voltage of node 103 up weakly and can only charge the parasitic capacitance of node 103 slowly. This causes the low-to-high voltage transition of node 103 to be slow.

Figure 3:
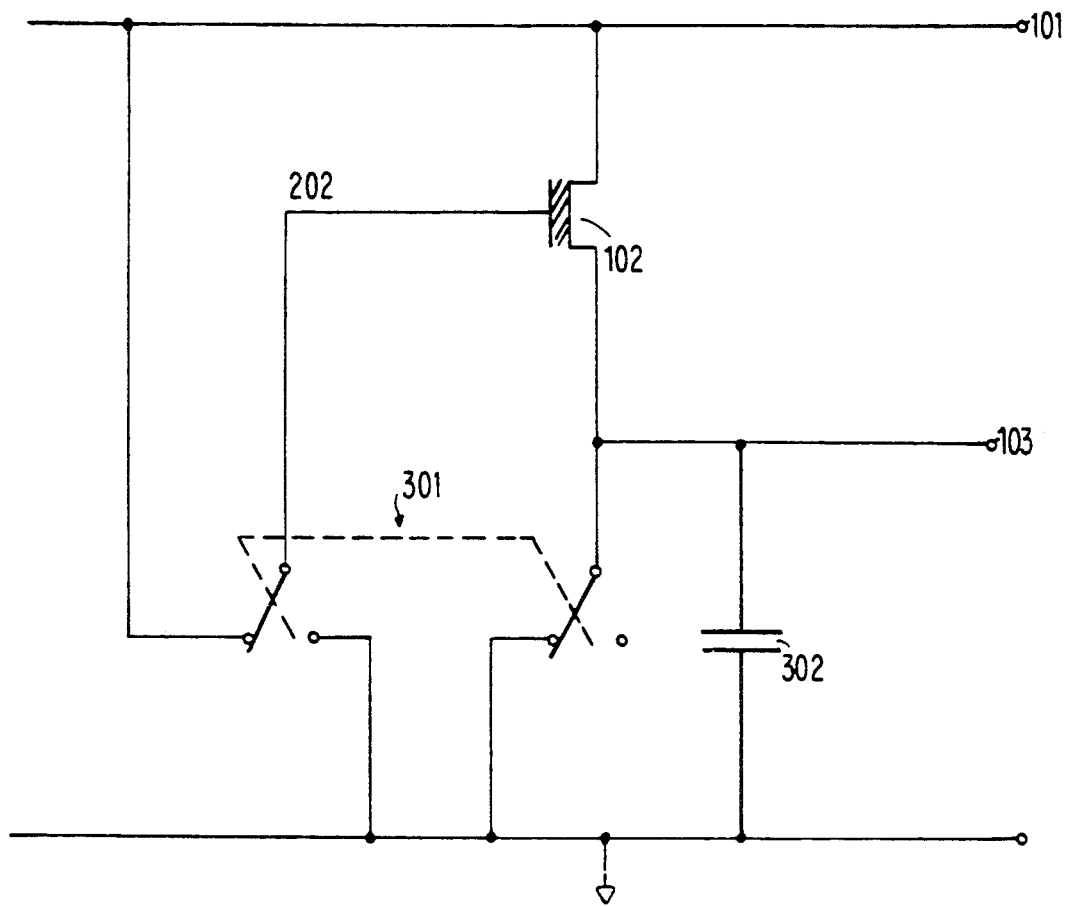
FIG. 3 is a block schematic diagram of the output stage of a sense amplifier, illustrating the cause of slow low-to-high output voltage transitions.

To study further the low-to-high transition of output node 103, consider the simplified schematic diagram of the pull-up circuit for output node 103 shown in FIG. 3. Switch 301 represents the function performed by transistors 105, 107, 201, 203, 204, 206, and 208. Capacitor 302 represents the parasitic capacitance of node 103. Node 202 is an "input" node which controls the state of the sense amplifier, and node 103 is the "output" node. With switch 301 in the position shown in FIG. 3, capacitor 302 is discharged and transistor 102 is off. When switch 301 changes to its alternate position, node 202 is pulled low and transistor 102 is switched on. Also, the short circuit across capacitor 302 is removed, and current flows through transistor 102 to charge capacitor 302. As the capacitor charges, the voltage of node 103 rises, but it does so slowly because transistor 102 cannot supply a large current.

Figure 4A:
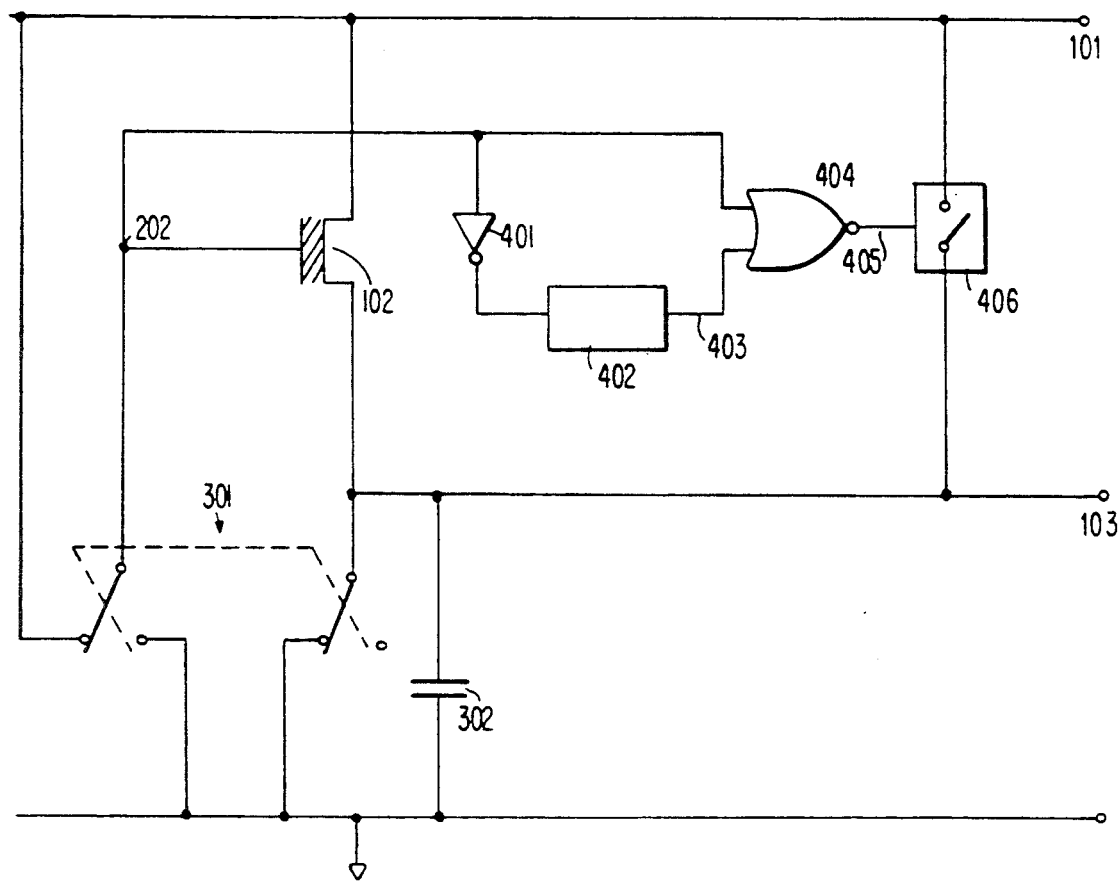
FIG. 4a is a block schematic diagram of an embodiment of the present invention.

FIG. 4a shows a block schematic diagram illustrating the principle of operation of an auxiliary pull-up circuit designed in accordance with the principles of the invention. The auxiliary pull-up circuit is connected to the simplified traditional pull-up circuit of FIG. 3. A principle of the invention is to assist transistor 102 to charge parasitic capacitor 302 rapidly during the low-to-high transition of node 103. At times other than the low-to-high transition, the circuit is designed to have no effect on the traditional pull-up circuit.

Figure 4B:
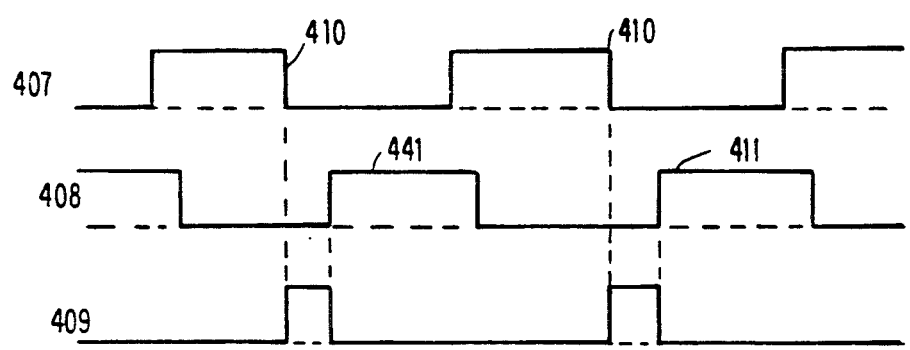

The operation of the circuit in FIG. 4a can be understood in conjunction with the voltage versus time traces shown in FIG. 4b. Trace 407 shows a possible voltage versus time waveform at "input" node 202. This is inverted by inverter 401 and delayed by delay circuit 402 to produce, at node 403, the waveform shown in trace 408. The waveforms shown in traces 407 and 408 are applied to the inputs of NOR gate 404 which produces, at node 405, the waveform shown in trace 409. When the voltage at node 405 (trace 409) is high, switch 406 closes and assists transistor 102 to pull the voltage of "output" node 103 high.

The high-to-low transition on input node 202 at time 410 initiates the low-to-high transition at node 103. At this time, the voltage at node 403 (trace 408) is also low. Thus, the output of NOR gate 404 goes high and closes switch 406. This pulls the voltage of node 103 up rapidly. At time 411, the delay introduced by delay circuit 402 elapses, and node 403 goes high. This causes the output of NOR gate 404 to go low, and thus to open switch 406. Trace 409 shows that the only time switch 406 is closed is between time 410 (when node 202 goes high), and time 411 (when the delay introduced by delay circuit 402 elapses). At all other times, switch 406 is open. Thus, the auxiliary pull-up circuit assists in pulling up node 103 during its low-to-high transition, but has no effect on the traditional pull-up circuit at other times.

Figure 5:
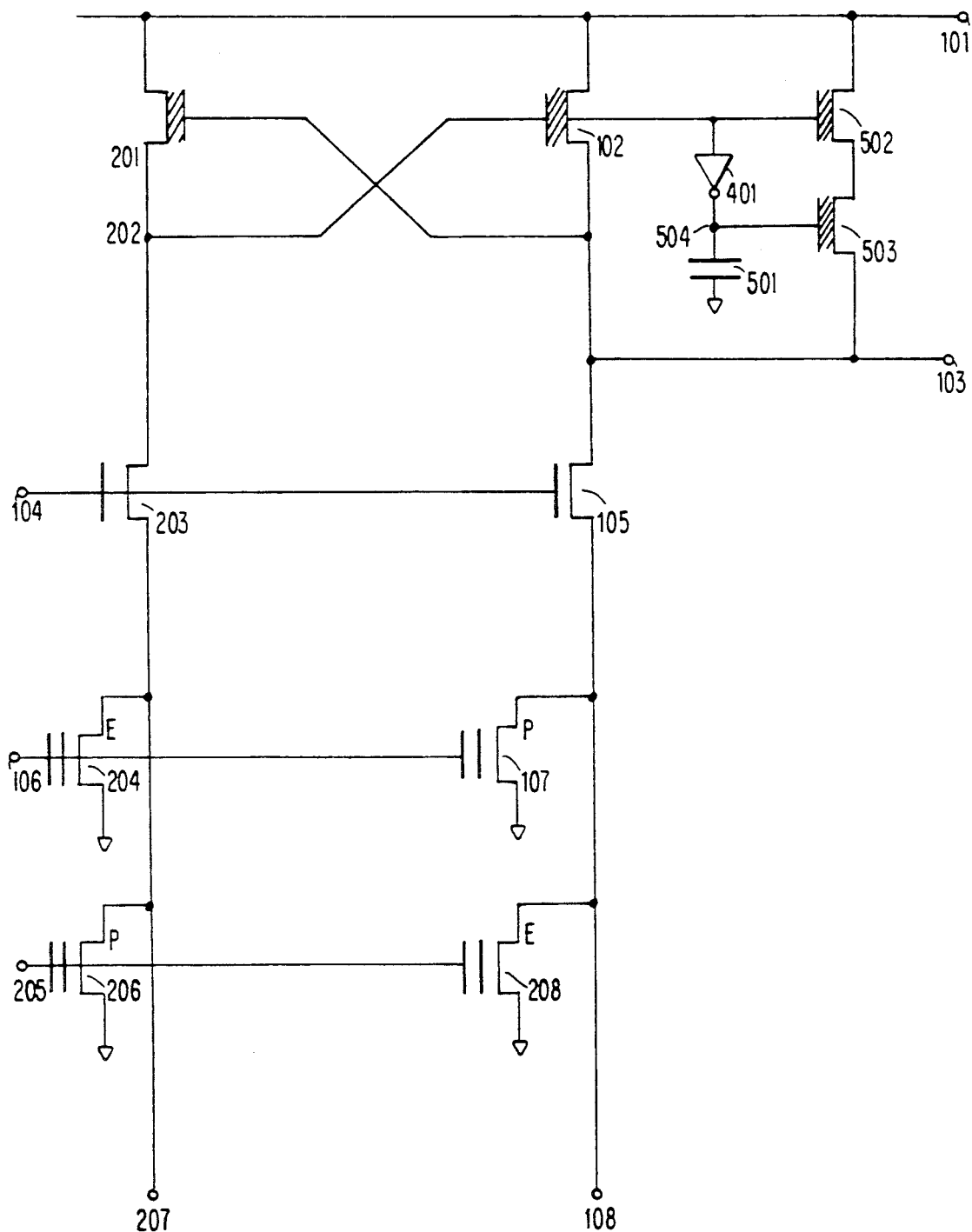
FIG. 5 is a block schematic diagram of a preferred embodiment of the invention.

FIG. 5 shows a schematic diagram of a preferred embodiment of a sense amplifier working in complementary bit line mode according to the principle described above. The sense amplifier is designed to eliminate quiescent power dissipation and to increase the speed of the low-to-high transition. The circuit comprises the same basic elements as the conventional sense amplifier of FIG. 2 with cross-coupled load transistors so that no quiescent power is consumed, but also includes an auxiliary active pull-up circuit for node 103. The pull-up circuit includes inverter 401, capacitor 501, and p-channel transistors 502 and 503. These components duplicate the operation of blocks 401, 402, 404, and 406 in FIG. 4 as described below.

Consider again the low-to-high transition of node 103, but now in the improved circuit of FIG. 5. The initial state is maintained by word line 106 being held low and word line 205 being held high. In this state, transistors 208, 105, 201, and 503 are switched on, and transistors 204, 102, and 502 are switched off. Node 202 is high, and nodes 103 and 504 are low. Capacitor 501 is discharged. The transition is initiated when the word lines change state. Word line 205 going low switches transistor 208 off, allowing bit line 108 to float. Word line 106 going high switches transistor 204 on. This pulls bit line 207 low, which switches transistor 203 on and pulls node 202 low. Node 202 going low switches pull-up transistor 102 on, which starts to increase the voltage of node 103. In addition, node 202 going low brings the auxiliary pull-up circuit into operation.

The auxiliary pull-up circuit functions as follows: When node 202 goes low, transistor 502 switches on, and the output of inverter 401 starts to go high. However, inverter 401 is designed to be weak so that it charges and discharges capacitor 501 slowly. Thus, node 504 remains low for a short time after node 202 goes low, and transistor 503 remains on. An active pull-up path for node 103 now exists through the channels of transistors 502 and 503 in series. This pulls the voltage of node 103 up, and because transistors 502 and 503 are large, the voltage is pulled up rapidly. After a few nanoseconds, inverter 401 charges capacitor 501 to a sufficiently high voltage to switch transistor 503 off and disconnect the auxiliary pull-up path. Thus, having performed its task of pulling node 103 up rapidly, the active pull-up circuit becomes inoperative. As in the conventional sense amplifier with complementary bit lines, node 103 is maintained high by transistor 102. However, this transistor can now be made smaller because it is not solely responsible for pulling node 103 high.

Consider now the high-to-low transition of node 103. This proceeds in exactly the same way as a high-to-low transition on the same node in the circuit of FIG. 2. The auxiliary pull-up circuit remains inactive and its presence does not affect the operation of the sense amplifier. Specifically, prior to the high-to-low transition of node 103, there is a low on node 202 which holds transistor 502 on, and there is a high on node 504 which holds transistor 503 off. When the transition occurs, just as in the circuit of FIG. 2, node 103 goes low and is followed a short time later by node 202 going high which switches transistor 502 off. After a short time, inverter 401 discharges capacitor 501 to a sufficiently low voltage to switch transistor 503 on. However, because transistor 502 is already off, no pull-up path is formed, and the auxiliary pull-up circuit does not directly affect the high-to-low transition of node 103.

The auxiliary pull-up circuit does, nevertheless, have an indirect advantageous effect on the high-to-low transition rate and a direct advantageous effect on the quiescent power consumption. The presence of the auxiliary pull-up circuit reduces the need for powerful pull-up capacity in transistor 102, and this transistor can be reduced in size so that node 103 is held high weakly. This node can therefore be pulled low rapidly, and the quiescent power consumption is reduced.

Another advantage of the auxiliary pull-up circuit is that it allows the user to choose whether the sense amplifier should operate in a complementary bit line mode as described above or in a single-ended bit line mode. This choice is made during programming of the PLD.

Referring again to FIG. 5, to operate the sense amplifier in single-ended bit line mode which duplicates exactly the operation of the circuit of FIG. 1, all transistors on bit line 207 are erased. Then when any word line goes high, node 202 is pulled low. The gate of transistor 102 is therefore held low just as it is in the circuit of FIG. 1 and behaves as an active pull-up for node 103. With node 202 held low, transistor 502 is held on and transistor 503 is held off and no auxiliary pull-up path is formed. Thus, the auxiliary pull-up circuit does not affect the operation of the PLD sense amplifier.

In summary, the auxiliary pull-up circuit has the advantages of: assisting the pull-up circuit of node 103; not degrading the already efficient pull-down circuit; consuming no quiescent power itself; reducing the quiescent power consumption of the sense amplifier as a whole; and allowing the sense amplifier to be operated either in single-ended bit line mode or complementary bit line mode at the discretion of the programmer.

It will be understood that the foregoing is merely illustrative of the principles of the invention, and that various modifications can be made by those skilled in the art without departing from the scope and spirit of the invention. For example, capacitor 501 may be replaced by a metal-oxide-semiconductor transistor with its drain and source grounded, and its gate connected to node 504.

We claim:

1. A sense amplifier for use in a programmable logic device, comprising:

a ground node having zero voltage;

a power supply node;

an input node;

an output node having an associated parasitic capacitance;

means for controlling said input node voltage;

means for controlling said output node voltage, responsive to said input node voltage, such that said output node is changed from a first predetermined voltage range to a second predetermined voltage range when said input node changes from said second predetermined voltage range to said first predetermined voltage range, and said output node is changed from said second predetermined voltage range to said first predetermined voltage range when said input node changes from said first predetermined voltage range to said second predetermined voltage range, said means for controlling said output node voltage being capable of supplying at most a predetermined amount of current to said output node;

an auxiliary switching circuit connected between said output node and said power supply node; and means for controlling said auxiliary switching circuit, responsive to said input node voltage changes, allowing current to flow through said auxiliary switching circuit to said output node during, and for a predetermined time after, transitions of said input node from said second predetermined voltage range to said first predetermined voltage range thereby assisting said means for controlling said output node voltage to charge said output node parasitic capacitance and reducing the time required for said output node to change from said first predetermined voltage range to said second predetermined voltage range.

2. The sense amplifier of claim 1 wherein the voltage of said power supply node is greater than the voltage of said ground node, the lowest voltage of said first predetermined voltage range is at least as high as the voltage of said ground node, the highest voltage of said second predetermined voltage range is at most as high as the voltage of said power supply node, and the lowest voltage in said second predetermined voltage range is at least as high as the highest voltage of said first predetermined voltage range.

3. The sense amplifier of claim 2 wherein said auxiliary switching circuit comprises a first p-channel metal-oxide-semiconductor transistor and a second p-channel metal-oxide-semiconductor transistor, the channels of said first p-channel metal-oxide-semiconductor transistor and said second p-channel metal-oxide-semiconductor transistor being connected in a series circuit from said power supply node to said output node, and the gate voltages of said first and second p-channel metal-oxide-semiconductor transistors controlled by said control circuit such that current can flow from said power supply node to said output node when said control circuit applies voltages in said first predetermined voltage range to the gates of both said first p-channel metal-oxide-semiconductor transistor and said second p-channel metal-oxide-semiconductor transistor, and such that current cannot flow through said auxiliary circuit from said power supply node to said output node if said control circuit applies a voltage in said second predetermined voltage range to at least one of the gates of said first p-channel metal-oxide-semiconductor transistor and said second p-channel metal-oxide-semiconductor transistor.

4. The sense amplifier of claim 3 wherein said means for controlling said auxiliary switching circuit comprises:

an inverter having an input and an output, said inverter input being connected to said input node and to said first p-channel metal-oxide-semiconductor transistor gate; and a delay circuit having an input connected to said inverter output and an output connected to said second p-channel metal-oxide-semiconductor transistor gate.

5. The sense amplifier of claim 4 wherein said inverter has an associated output resistance, and said delay circuit comprises a series connection of said output resistance and a capacitor.

6. The sense amplifier of claim 4 wherein said inverter has an associated output resistance, and said delay circuit comprises a series connection of said output resistance and a metal-oxide-semiconductor transistor operating as a capacitor.

7. In a sense amplifier having a ground node having zero voltage, a power supply node, an input node, an output node having an associated parasitic capacitance, means for controlling said input node voltage, means for controlling said output node voltage, responsive to said input node voltage, such that said output node is changed from a first predetermined voltage range to a second predetermined voltage range when said input node changes from said second predetermined voltage range to said first predetermined voltage range, and said output node is changed from said second predetermined voltage range to said first predetermined voltage range when said input node changes from said first predetermined voltage range to said second predetermined voltage range, said means for controlling said output node voltage being capable of supplying at most a predetermined amount of current to said output node, a circuit for reducing the time required for the voltage of said output node to change from said first predetermined voltage range to said second predetermined voltage range, comprising:

a fifth node;

means for inverting and delaying the voltage of said input node, and applying said delayed and inverted voltage to said fifth node;

a sixth node;

a first p-channel metal-oxide-semiconductor transistor having a drain connected to said power supply node, a gate connected to said input node, and a source connected to said sixth node; and a second p-channel metal-oxide-semiconductor transistor having a drain connected to said sixth node, a gate connected to said fifth node, and a source connected to said output node, whereby said second p-channel metal-oxide-semiconductor transistor is switched on when said input node is switched to said first predetermined voltage range to allow current to flow from said power supply node through said first and second p-channel metal-oxide-semiconductor transistors to charge said output node parasitic capacitance and thereby to reduce the time required for the voltage of said output node to change from said first predetermined voltage range to said second predetermined voltage range, and whereby said second p-channel metal-oxide-semiconductor transistor is switched off after said means for inverting and delaying has raised said fifth node to said second predetermined voltage range, thereby preventing further current from flowing through said first and second p-channel metal-oxide-semiconductor transistors.

8. In a sense amplifier for use in a programmable logic device, comprising:

a ground node having zero voltage;

a power supply node;

an input node;

an output node having an associated parasitic capacitance;

means for controlling said input node voltage;

means for controlling said output node voltage, responsive to said input node voltage, such that said output node is changed from a first predetermined voltage range to a second predetermined voltage range when said input node changes from said second predetermined voltage range to said first predetermined voltage range, and said output node is changed from said second predetermined voltage range to said first predetermined voltage range when said input node changes from said first predetermined voltage range to said second predetermined voltage range, said means for controlling said output node voltage being capable of supplying at most a predetermined amount of current to said output node, the method of decreasing the time required for the voltage of said output node to change from said first predetermined voltage range to said second predetermined voltage range, said method comprising the steps of:

allowing current to flow from said supply voltage node to said output node through an auxiliary circuit during, and for a predetermined time after, transitions of said input node voltage from said second predetermined voltage range to said first predetermined voltage range; and disallowing current to flow through said auxiliary circuit at times other than during, and for a predetermined time after, transitions of said input node from said second predetermined voltage range to said first predetermined voltage range.

* * * * *